(12) United States Patent
Sato

(10) Patent No.: US 6,304,133 B1
(45) Date of Patent: Oct. 16, 2001

(54) MOVING AVERAGE FILTER

(75) Inventor: Hisatake Sato, Miyazaki-gun (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/512,345

(22) Filed: Feb. 24, 2000

(30) Foreign Application Priority Data

Feb. 26, 1999 (JP) .................................................. 11-050625

(51) Int. Cl.⁷ ............................... H03K 5/00; G06F 15/31
(52) U.S. Cl. ........................ 327/552; 708/321; 708/312; 327/551
(58) Field of Search ................................... 327/552, 551; 708/312, 321

(56) References Cited

U.S. PATENT DOCUMENTS 5,079,734 * 1/1992 Riley ..................................... 708/312
5,301,134 * 4/1994 Maruyama ........................... 708/312

FOREIGN PATENT DOCUMENTS 9-238048    9/1997   (JP) .

* cited by examiner

Primary Examiner—Dinh T. Le
(74) Attorney, Agent, or Firm—Rabin & Berdo, P.C.

(57) ABSTRACT

A moving averaging filter which does not propagate a calculation error is provided reducing the size of the hardware. This moving average filter has a data holding unit for holding multiple successive data, a coefficient storing unit for storing coefficients, a first adder which calculates the sum of a pair of data of a prescribed combination held in the data holding unit, a multiplier which multiplies the sum to coefficient data obtained from the coefficient storing unit, and a second adder which adds up a prescribed number of multiplication results produced by the multiplier.

5 Claims, 6 Drawing Sheets

MOVING AVERAGE FILTER

BACKGROUND OF THE INVENTION

1. Field of the Invention

The present invention relates to an average calculating circuit which calculates and outputs the average of an input signal, in particular to a moving average filter for calculating the moving average of the input signal.

2. Description of Related Art

The moving averaging method is a method for smoothing a signal (For example, Reference I: "Beginner's Digital Filter" Nov. 30, 1989 pp. 9–15 by Shougo Nakamura, Tokyo Denki University Press). According to this moving averaging method, the moving average is calculated as follows. When the k-th moving average is available and the (k+1)-th moving average needs to be calculated, the difference between the oldest data of all the data used in obtaining the k-th moving average and the new data that is input to obtain the (k+1)-th moving average is added to the k-th moving average to obtain the (k+1)-th moving average (p14 in Reference I). The advantage of this method is that the amount of computation in obtaining the moving average is reduced. However, since the difference between the oldest data and the new data is added to the moving average already obtained to obtain the next moving average, once a calculation error occurs by a noise or an operation error, the calculation error propagates indefinitely, which is a problem.

Moreover, occasionally in the prior art, moving averages are first obtained in multiple stages and the moving average of the multiple moving averages is taken. When the number of stages of the moving averages is large, the amount of hardware has to be increased to a great extent in accordance with the number of the moving averages, which is another problem.

SUMMARY OF THE INVENTION

Given these problems, it is an object of the present invention to provide a moving average filter capable of solving these problems.

To solve the above-stated problems, a representative moving average filter according to the present invention has a data holding unit for holding multiple successive data, a coefficient storing unit for storing coefficients, a first adder which calculates the sum of a pair of data of a prescribed combination held in the data holding unit, a multiplier which multiplies the sum by coefficient data obtained from the coefficient storing unit, and a second adder which adds up a prescribed number of multiplication results produced by the multiplier.

DETAILED DESCRIPTION OF THE INVENTION

First Embodiment

Conventionally, when taking the moving average of multiple moving averages, multiple moving average calculating circuits are connected in stages. In the present invention, a FIR (Finite Impulse Response) type filter is used to take the moving average of multiple moving averages.

In what follows, an embodiment of the present invention will be explained with reference to the attached drawings.

Figure 1:
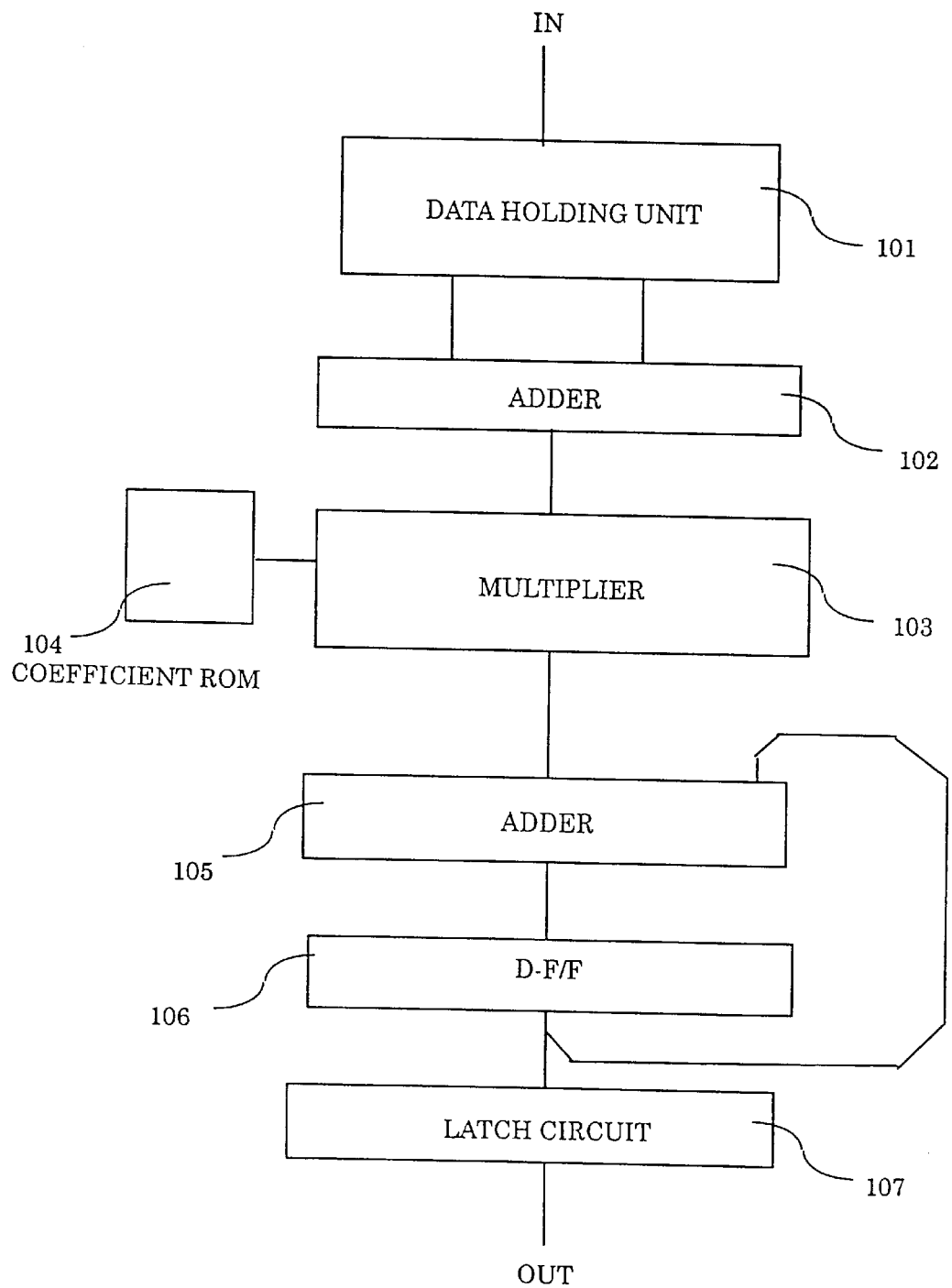
FIG. 1 is a block diagram showing the first embodiment of the present invention.

FIG. 1 is a block diagram showing the moving average calculating circuit according to the first embodiment of the present invention. In this moving average calculating circuit, a 1-bit signal is input to a data holding unit 101 having a RAM or a shift register. This data holding unit 101 holds a minimum number of data required to calculate the moving average in the present invention. In the present embodiment, at least 22 successive data are held in the data holding unit 101. Two data are read from the data holding unit 101 as needed. These two data are input to the two input terminals of an adder 102. The adder 102 then outputs a signal to a multiplier 103. Coefficient data are also input to the multiplier 103 from a coefficient ROM 104 that functions as a coefficient storage unit. The multiplier 103 outputs a signal to one of the input terminals of another adder 105. The adder 105 outputs a signal to a D-F/F 106. The D-F/F 106 outputs a signal to the other input terminal of the adder 105 and a latch circuit 107. The latch circuit 107 then outputs a signal that becomes the output signal OUT of the moving average.

In the present embodiment, three moving average filters are serially connected in stages, each of which takes the moving average of eight data.

First, the first data to be used to take the moving average is denoted by $D_0$. The other data $D_1$ through $D_7$ to be used to take the moving average are input in sequence for every sampling time t. The time at which the eighth data $D_7$ is input is set to T=0. The moving average data $Ma_0$ of the first stage moving average filter at T=0 is $$Ma_0 = (D_0 + D_1 + \ldots + D_7)/8.$$

Since this is a moving average, this value changes every time the period of the sampling time t passes. The time at which the (n+8)-th data $D_{n+7}$ is input is inductively set to T=n (where n is a non-negative integer). Then, the moving average data $Ma_n$ of the first stage moving average filter at T=n is $$Ma_n = (D_n + D_{n+1} + \ldots + D_{n+7})/8 \qquad (1)$$

The second stage moving average filter connected to the first stage moving average filter takes the average of the eight output data supplied from the first stage moving average filter.

The moving average data output of the second stage moving average filter at T=7 is denoted by $Mb_0$. Then, $Mb_0$ is expressed by $$Mb_0 = (Ma_0 + Ma_1 + \ldots + Ma_7)/8.$$

Substituting equation (1) into each of the $Ma_0$ through $Ma_7$, the above-equation becomes $$Mb_0 = (D_0 + 2D_1 + 3D_2 + \ldots 6D_5 + 7D_6 + 8D_7 + 7D_8 + 6D_9 + \ldots + 3D_{12} + 2D_{13} + D_{14})/8^2.$$

At T=n, the output of the second stage moving average filter is $$Mb_n = (D_n + 2D_{n+1} + 3D_{n+2} + 4D_{n+3} + 5D_{n+4} + 6D_{n+5} + 7D_{n+6} + 8D_{n+7} + 7D_{n+8} + 6D_{n+9} + 5D_{n+10} + 4D_{n+11} + 3D_{n+12} + 2D_{n+13} + D_{n+14})/8^2 \quad (2).$$

Next, the third stage moving average filter connected to the second stage moving average filter takes the average of the eight output data supplied from the second stage moving average filter. The moving average data output of the third stage moving average filter at T=14 is denoted by $Mc_0$. Then, $Mc_0$ is expressed by $$Mc_0 = (Mb_0 + Mb_1 + \ldots + Mb_7)/8.$$

Substituting equation (2) into each of the $Mb_0$ through $Mb_7$, the output of the third stage moving average filter at time T=n becomes $$Mc_n = (D_n + 3D_{n+1} + 6D_{n+2} + 10D_{n+3} + 15D_{n+4} + 21D_{n+5} + 28D_{n+6} + 36D_{n+7} + 42D_{n+8} + 46D_{n+9} + 48D_{n+10} + 48$$

$$D_{n+11} + 46D_{n+12} + 42D_{n+13} + 36D_{n+14} + 28D_{n+15} + 21D_{n+16} + 15D_{n+17} + 10D_{n+18} + 6D_{n+19} + 3D_{n+20} + D_{n+21})/8^3 = \{$$

$$(D_n + D_{n+21}) + 3(D_{n+1} + D_{n+20}) + 6(D_{n+2} + D_{n+19}) + 10(D_{n+3} + D_{n+18}) + 15$$

$$(D_{n+4} + D_{n+17}) + 21(D_{n+5} + D_{n+16}) + 28(D_{n+6} + D_{n+15}) + 36(D_{n+7} + D_{n+14}) + 42$$

$$(D_{n+8} + D_{n+13}) + 46(D_{n+9} + D_{n+13}) + 48(D_{n+10} + D_{n+11})\}/8^3 \quad (3)$$

Figure 2:
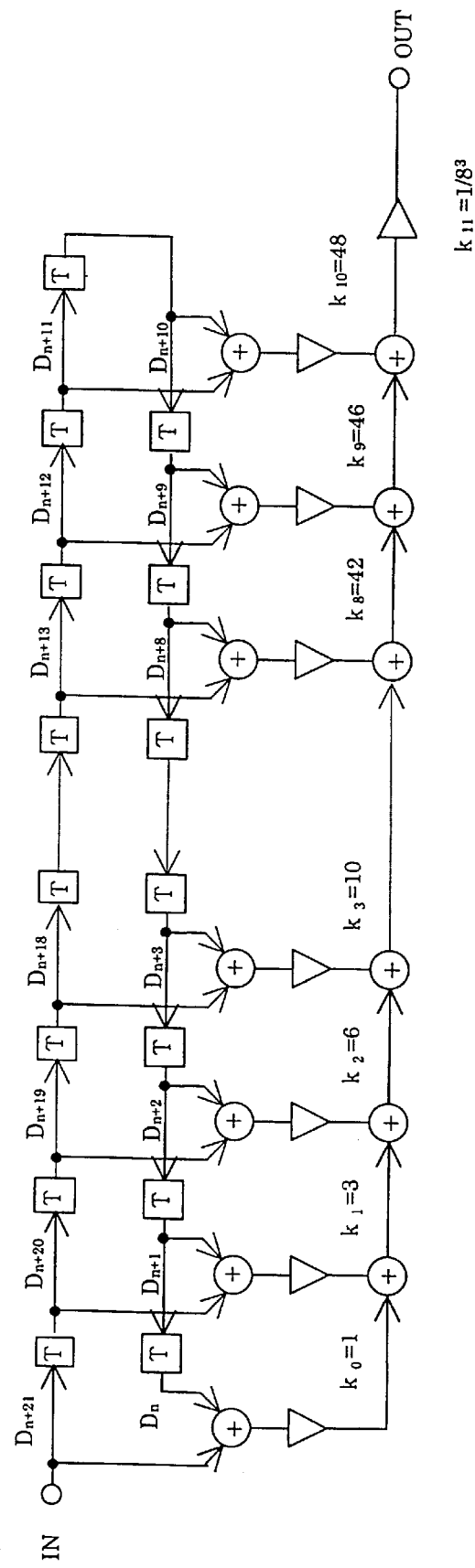
FIG. 2 shows the signal flow of the FIR filter of the present invention.

Equation (3) shows that the moving average can be obtained using a FIR (Finite Impulse Response) type filter of 11-th order. FIG. 2 shows the signal flow of the FIR filter for realizing equation (3).

In what follows, the operation of the moving average filter according to the first embodiment will be explained with reference to FIGS. 1 and 2.

1-bit data are input sequentially to the data holding unit 101. The data holding unit 101 holds 22 successive data. The data holding unit 101 reads the newest data $D_{n+21}$ and the oldest data $D_n$. These data $D_n$ and $D_{n+21}$ are sent to the adder 102, and the adder 102 add up $D_n$ and $D_{n+21}$. The adder 102 then sends the result of the addition to the multiplier 103. The coefficient ROM 104 reads and supplies the coefficient $k_0 = 1$ to the multiplier 103. The multiplier 103 then multiplies the coefficient $k_0 = 1$ to the result of the addition. The multiplier 103 then sends the multiplication result to the adder 105. The output data of the adder 105 is held in the D-F/F 106 temporarily.

Next, the data holding unit 101 reads data $D_{n+1}$ and $D_{n+20}$. These data $D_{n+1}$ and $D_{n+20}$ are sent to the adder 102, and the adder 102 add up $D_{n+1}$ and $D_{n+20}$. The adder 102 then sends the result of the addition to the multiplier 103. The coefficient ROM 104 reads and supplies the coefficient $k_1 = 3$ to the multiplier 103. The multiplier 103 then multiplies the coefficient $k_1 = 3$ to the result of the addition. The multiplier 103 then sends the multiplication result to one of the two input terminals of the adder 105. The output data of the adder 105 temporarily held in the D-F/F 106 is fed back to the other input terminal of the adder 105 when the multiplication result $(D_{n+1} + D_{n+20}) * k_1$ is input to the one input terminal of the adder 105. In other words, the result that had been obtained in the previous timing by the adder 105 is cumulated. In the same manner, the adder 102 adds up the data $D_m$ and $D_{2n+21-m}$ (m=n, n+1, . . . , n+10) read by the data holding unit 101. The multiplier 103 then multiplies the sum $D_m + D_{2n+21-m}$ to the coefficient $k_l$ (l=1 through 10) read by the coefficient ROM 104. The adder 105 then cumulates the multiplication result. This process id repeated. After this, the latch circuit 107 receives a latch signal from a timing generating circuit not shown in the drawing when the quantities in the numerator of equation (3), that is, all the quantities shown in FIG. 2, are all cumulated. The latch circuit 107 then latches the calculation result, and outputs the moving average as the final output.

In order to make the final result precise, the denominator of equation (3) needs to be calculated and multiplied by $k_{11} = 1/8^8$ (division by $8^3$). In general, a multiplication by $2^n$ in the binary system can be carried out by shifting the output upward by n bit, and a division by $2^n$ in the binary system can be carried out by shifting the output downward by n bit. Hence in practice, when wiring from the D-F/F(F) to the latch circuit 107, for example, a division by $2^9$ in the binary system can be realized by connecting the D-F/F(F) to the latch circuit 107 so as to shift the output downward by 9 bit. Therefore, a division by $8^3$ in the decimal system, which is equivalent to a division by $2^9$ in the binary system, can be realized by connecting the D-F/F(F) to the latch circuit 107 so as to shift the output downward by 9 bit. This division by $8^3$ in the decimal system requires no additional special hardware and can be achieved easily.

Thus, according to the first embodiment of the present invention, a FIR filter configuration is used. Therefore, even if a calculation error is generated by a noise or an operation error, a normal output result can be obtained in the next calculation cycle. Moreover, even if the average number of moving averages and the number of stages of the serial connection are changed, it suffices to adjust the number of bits in the adders and the multiplier and the coefficient ROM to cope with these changes without significantly increasing the area of the hardware.

Second Embodiment

Figure 3:
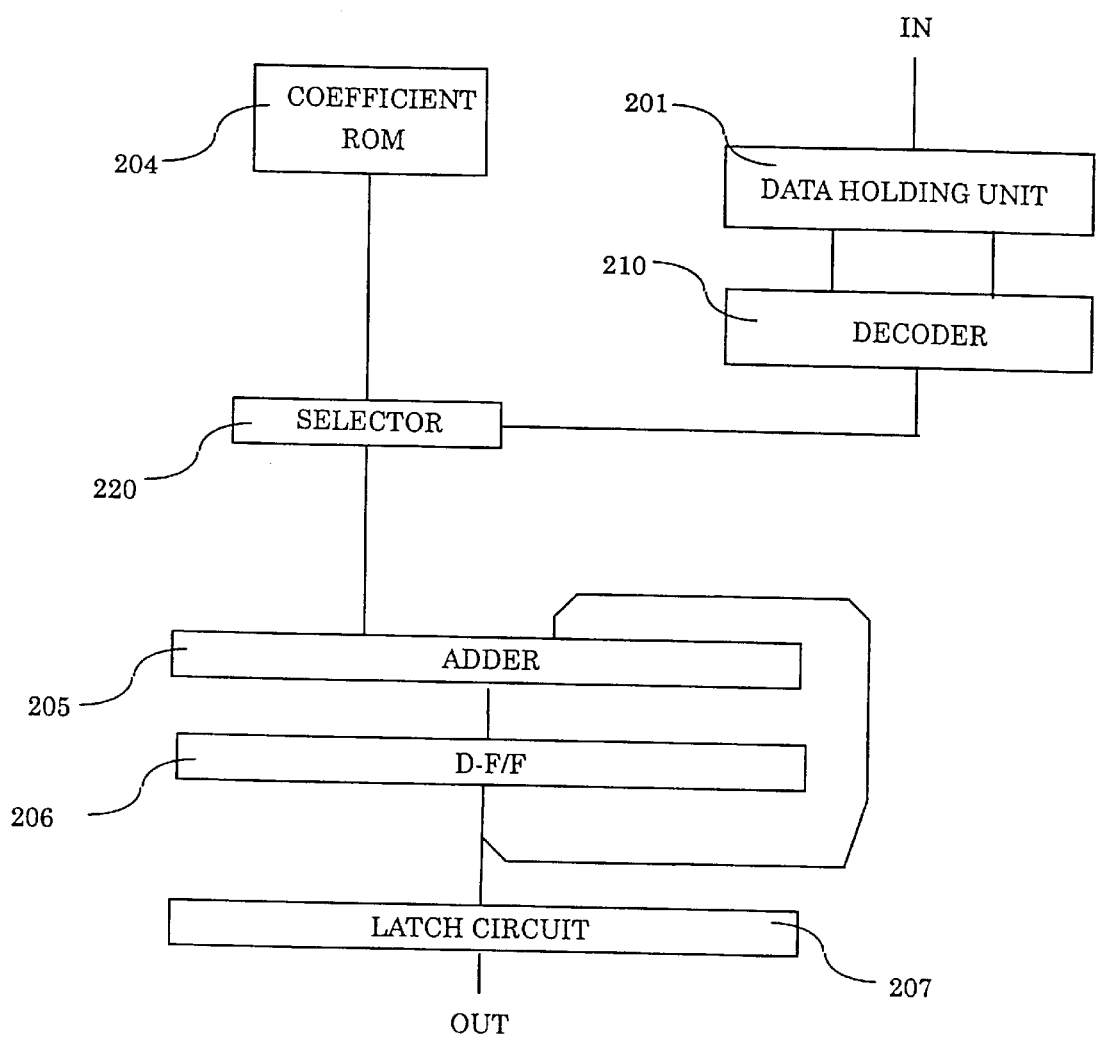
FIG. 3 is a block diagram showing the second embodiment of the present invention.

FIG. 3 is a block diagram showing the configuration of a moving average calculating circuit according to the second embodiment of the present invention. In this moving average calculating circuit, as in the case of the first embodiment, a 1-bit input signal is input to a data holding unit 201 having a RAM or shift register. This data holding unit 201 reads two data and sends the two data to the two input terminals of a decoder 210. The decoder 210 then sends an output signal to the select terminal of a selector 220. A coefficient ROM 204 supplies coefficient data to the selector 220. The selector 220 outputs an output signal to one of the two input terminals of an adder 205. The adder 205 outputs an output signal to a D-F/F 206. The output signal of the D-F/F 206 is input to the other input terminal of the adder 205 and a latch circuit 207. The signal output from the latch circuit 207 is the moving average output signal OUT.

In what follows, the operation in the second embodiment will be explained. 1-bit data are input sequentially to the data holding unit 201. The data holding unit 201 holds 22 successive data. As in the first embodiment, the data holding unit 201 reads pairs of data $D_n$ and $D_{n+21}$, $D_{n+1}$ and $D_{n+20}$, . . . , $D_{n+10}$ and $D_{n+11}$ as shown in equation (3).

The decoder 210 outputs decode value signals corresponding to the values of the read two data as shown in Table 1.

TABLE 1

Decode values (m = 0 through n + 10)
of the decoder 210 of the second embodiment

| Input Data $D_m$ | Input Data $D_{2n+21-m}$ | $D_m + D_{2n+21-m}$ | Decode Value Signal |
|---|---|---|---|
| 0 | 0 | 0 | Zero |
| 0 | 1 | 1 | Through |
| 1 | 0 | 1 | Through |
| 1 | 1 | 10 | Shift |

In other words, the decoder 210 outputs a zero signal when the sum of the two input signals is 0, a through signal when the sum of the two input signals is 1, and a shift signal when the sum of the two input signals is 2.

Figure 4:
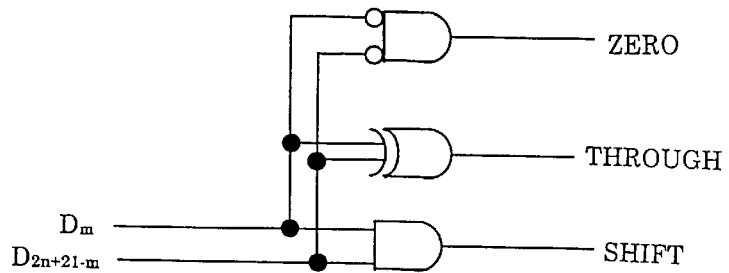
FIG. 4 is a circuit diagram of the decoder according to the second embodiment of the present invention.

FIG. 4 shows an exemplary circuit of the decoder 210. The decoder 210 has an AND circuit, an EX_OR circuit, and a NOR circuit, to each of which the above-mentioned two input signals are supplied. The AND circuit outputs a shift signal. The EX_OR circuit outputs a through signal. The NOR circuit outputs a zero signal. This can be changed with a logic circuit that satisfied the logic shown in Table 1.

The selector 220, which functions as a coefficient processing unit, operates in response to the decode value signal supplied from the decoder 210. When the selector 220 receives a zero signal from the decoder 210, the selector 220 outputs an "L" level signal as addition data regardless of the signal supplied from the coefficient ROM 204. When the selector 220 receives a through signal from the decoder 210, the selector 220 outputs the signal supplied from the coefficient ROM 204 as it is. When the selector 220 receives a shift signal from the decoder 210, the selector 220 shifts upward by 1 bit the signal supplied from the coefficient ROM 204 and outputs the shifted signal.

Figure 5:
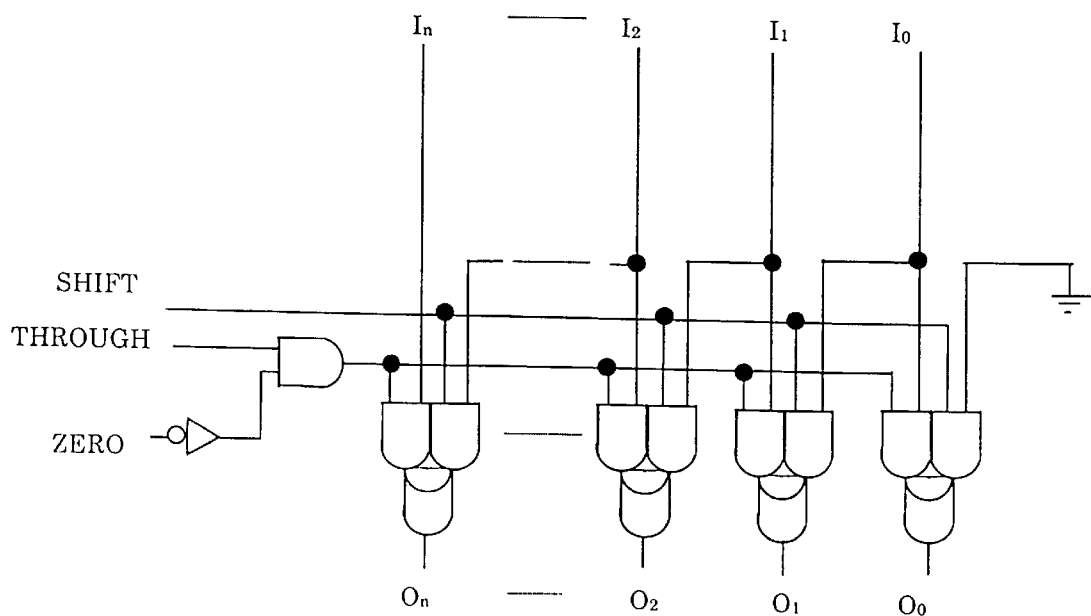
FIG. 5 is a circuit diagram of the selector according to the second embodiment of the present invention.

FIG. 5 shows an exemplary circuit of the selector 220.

The adder 205 adds the addition result of the cycle immediately before the present cycle held in the D-F/F 206 to the addition data received from the selector 220 and outputs the new addition result to the D-F/F 206. When the entire addition is over, the latch circuit 207 latches the output signal of the D-F/F 206 based on the latch signal.

The output signal from the latch circuit 207 is output as the moving average.

Thus, the decoder 210 adds up the data inside the parentheses ( ) of equation (3), that is, pairs of data $D_n$ and $D_{n+21}$, $D_{n+1}$ and $D_{n+20}$, ..., $D_{n+10}$ and $D_{n+11}$, and outputs a decode value signal that corresponds to the addition result. Based on this decode value signal, the coefficient value read by the coefficient ROM 204 is processed. This processed coefficient value is cumulated to obtain the moving average.

Hence, according to the second embodiment, the same advantages as in the first embodiment can be achieved. Moreover, since these advantages can be achieved using a simple decoder circuit and a selector circuit without using a multiplier, the area required by the hardware is reduced.

Third Embodiment

Figure 6:
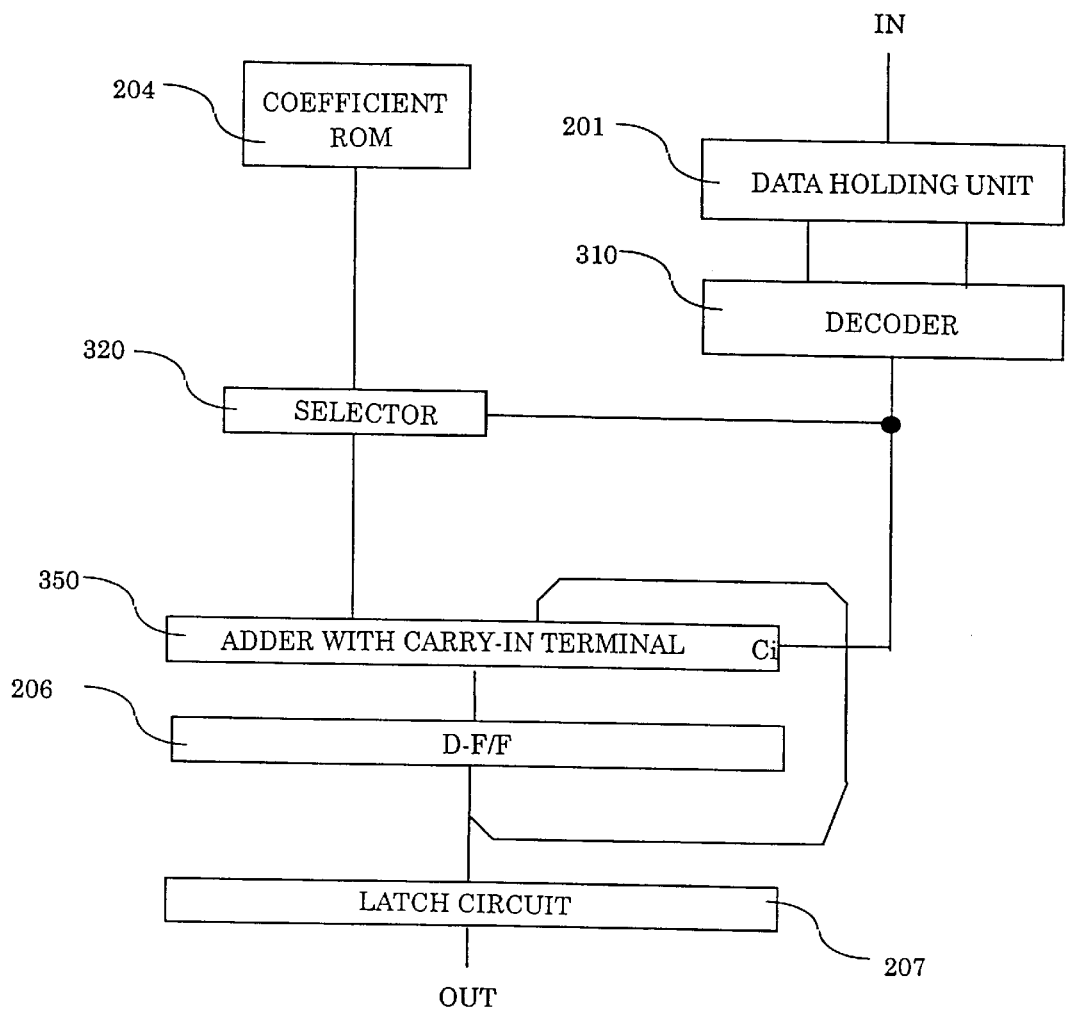
FIG. 6 is a block diagram showing the third embodiment of the present invention.

FIG. 6 is a block diagram showing a moving average calculating circuit according to the third embodiment of the present invention. In FIG. 6, the same reference numerals are given to the same components that are already used in the second embodiment. The configurations of the decoder 310, the selector 320, the adder with carry-in terminal 350 of the moving average calculating circuit of the third embodiment differ from the configurations of corresponding ones of the second embodiment. The output signal from the decoder 310 is input to the selector 320 and the carry-in signal terminal Ci of the adder with carry-in terminal 350.

The same two data are read by the decoder 310 as in the second embodiment. This decoder 310 performs the decoding operation shown in Table 2. The decoder 310 then outputs the result of the decoding as a select signal to the carry-in terminal Ci of the adder with carry-in terminal 350.

TABLE 2

Decode values (m = 0 through n + 10)
of the decoder 310 of the second embodiment

| Input Data $D_m$ | Input Data $D_{2n+21-m}$ | $D_m + D_{2n+21-m}$ | Decode Value Signal |
|---|---|---|---|
| 0 | 0 | 0 | Minus |
| 0 | 1 | 1 | Zero |
| 1 | 0 | 1 | Zero |
| 1 | 1 | 10 | Through |

For example, when the sum of $D_n$ and $D_{n+21}$ input to the decoder 310 is 0, the decoder 310 outputs a minus signal. When the sum of $D_n$ and $D_{n+21}$ input to the decoder 310 is 1, the decoder 310 outputs a zero signal. When the sum of $D_n$ and $D_{n+21}$ input to the decoder 310 is 10, the decoder 310 outputs a through signal. When the selector 320 receives a minus signal from the decoder 310, the selector 320 outputs a signal inverting the polarity of the signal received from the coefficient ROM 204. When the selector 320 receives a zero signal from the decoder 310, the selector 320 outputs an "L" level signal regardless of the signal received from the coefficient ROM 204. When the selector 320 receives a through signal from the decoder 310, the selector 320 outputs the signal received from the coefficient ROM 204 as it is. Only when the decoder 310 outputs a minus signal, the decoder 310 outputs an "H" level signal to the adder with carry-in terminal 350. In all the other case, the decoder 310 outputs an "L" level signal to the adder with carry-in terminal 350.

In general, 1-bit data output from the $\Delta\Sigma$ system A/D converter is binary level data having "H" or "L" value. Data of complement form of 2 is used in the calculation in the block after the moving average filter. In the circuit of the second embodiment, a conversion block is required after the moving average block for converting a binary level signal into data of complement form of 2. However, by using the decoder 310 of the third embodiment, a binary level signal can be converted into data of complement form of 2 in the moving average block simultaneously. In other words, the coefficient value is added when the sum of the values inside the parenthesis ( ) of equation (3) is 10, the coefficient value is not added when the sum of the values inside the parenthesis ( ) of equation (3) is 1, and the coefficient value is subtracted when the sum of the values inside the parenthesis ( ) of equation (3) is 0. In this way, the binary level signal can be converted into data of complement form of 2 whose output value has a sign. Thus, by performing the operation using the decoder, processing the coefficient value based on the result of the operation, and cumulating the results of the addition, the moving average can be calculated.

Figure 7:
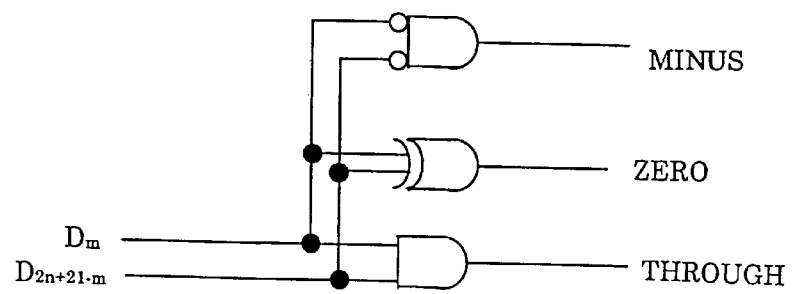
FIG. 7 is a circuit diagram of the decoder according to the third embodiment of the present invention.
Figure 8:
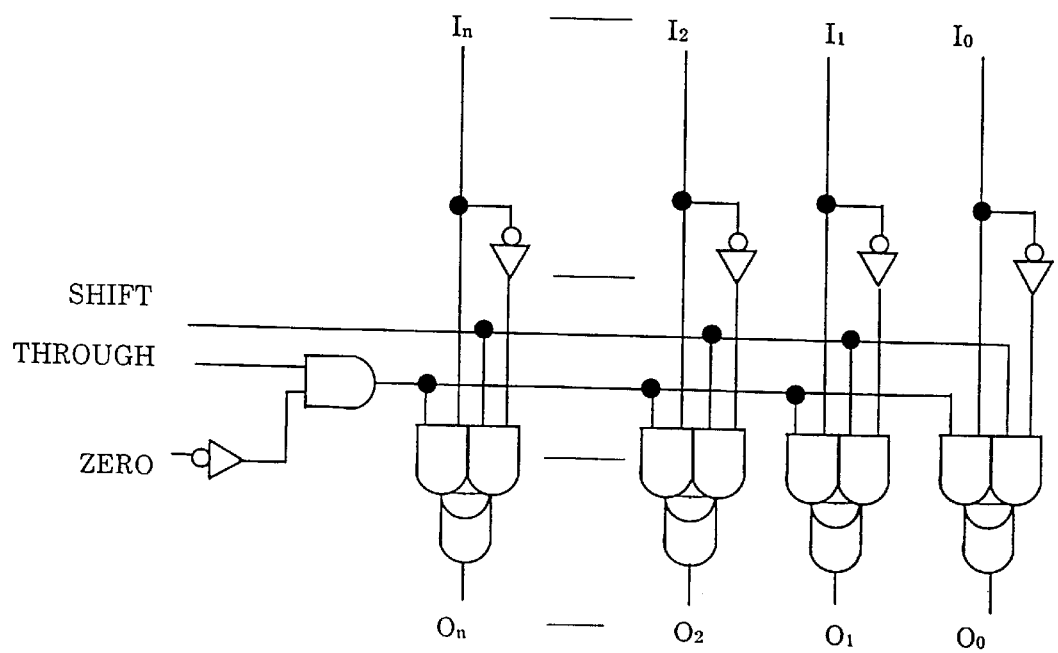
FIG. 8 is a circuit diagram of the selector according to the third embodiment of the present invention.

FIG. 7 is a circuit diagram of the decoder according to the third embodiment of the present invention. FIG. 8 is a circuit diagram of the selector according to the third embodiment of the present invention.

Hence, according to the third embodiment of the present invention, the same advantages can be achieved as in the first and second embodiments. Moreover, since the converter for converting a binary level signal into data of complement form of 2 is used in the third embodiment, the area occupied by the hardware can be further reduced.

What is claimed is:

1. A moving average filter comprising a data holding unit for holding a plurality of successive data;

a coefficient storing unit for storing a coefficient;

a decode value signal outputting unit which calculates a sum of a pair of data of a prescribed combination held in said data holding unit and outputs a decode value signal that corresponds to said sum;

a coefficient processing unit which processes coefficient data obtained from said coefficient storing unit based on said decode value signal output from said decode value signal outputting unit and outputs said processed coefficient data as addition data; and an adder which cumulates a prescribed number of said addition results sequentially;

wherein said decode value signal outputting unit outputs a first signal which fixes an output regardless of coefficient data obtained from said coefficient storing unit, a second signal which passes coefficient data obtained from said coefficient storing unit, and a third signal which shifts by a prescribed number of bits coefficient data obtained from said coefficient storing unit.

2. A moving average filter comprising:

a data holding unit, which holds a plurality of successive data and outputs a first signal and a second signal;

a decoder unit, which has a first logic circuit outputting a zero signal when both the first signal and the second signal have a low level, a second logic circuit outputting a through signal when either the first signal or the second signal, but not both, has a high level, and a third logic circuit outputting a shift signal when both the first signal and the second signal have the high level;

a coefficient storing unit, which stores a coefficient and outputs a coefficient signal;

a selector unit, which outputs a third signal having a low level when the zero signal is input from the decoder unit, the coefficient signal as the third signal when the through signal is input from the decoder unit or a shifted signal shifting the coefficient signal as the third signal when the shift signal is input from the decoder; and an accumulator unit, which accumulates the signal output from the selector unit.

3. The moving average filter in accordance with claim 2, wherein the selector unit has a fourth logic circuit outputting a first logic result when the through signal has high level and when the zero signal has low level and at least one logic operation circuit, wherein the logic operation circuit has a fifth logic circuit outputting a second logic result when both the first logic result and nth coefficient signal are high level, where n is natural number, a sixth logic circuit outputting a third logic result when both (n−1)th coefficient signal and the shift signal are high level and a seventh logic circuit outputting the third signal when either the second logic result or the third logic result is high level.

4. A moving average filter comprising:

a data holding unit, which holds a plurality of successive data and outputs a first signal and a second signal;

a decoder unit, which has a first logic circuit outputting a minus signal when both the first signal and the second signal have low level, a second logic circuit outputting a through signal when either the first signal or the second signal, but not both, has high level and a third logic circuit outputting a shift signal when both the first signal and the second signal have high level;

a coefficient storing unit, which stores a coefficient and outputs a coefficient signal;

a selector unit which outputs a signal inverting the coefficient signal as a third signal and a carry signal when the minus signal is input from the decoder unit, a signal having low level as the third signal when the zero signal is input from the decoder unit or the coefficient signal as the third signal when the through signal is input from the decoder; and an accumulator unit moves a figure place to the right when the carry signal is input from the decoder unit and accumulates the signal output from the selector unit.

5. The moving average filter in accordance with claim 4, wherein the selector unit has a fourth logic circuit outputting a first logic result when the through signal has high level and when the zero signal has low level and at least one logic operation circuit, wherein the logic operation circuit has a fifth logic circuit outputting a second logic result when both the first logic result and nth coefficient signal are high level, where n is natural number, a sixth logic circuit outputting a third logic result when both inverted nth coefficient signal and the minus signal are high level and a seventh logic circuit outputting the third signal when either the second logic result or the third logic result is high level.

* * * * *